United States Patent
Liao et al.

(10) Patent No.: US 11,588,086 B2
(45) Date of Patent: Feb. 21, 2023

(54) MICRO-LED DISPLAY

(71) Applicant: PlayNitride Display Co., Ltd., MiaoLi County (TW)

(72) Inventors: Kuan-Yung Liao, MiaoLi County (TW); Yun-Li Li, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 224 days.

(21) Appl. No.: 16/953,352

(22) Filed: Nov. 20, 2020

(65) Prior Publication Data
US 2022/0045248 A1 Feb. 10, 2022

(30) Foreign Application Priority Data
Aug. 10, 2020 (TW) ................. 109126989

(51) Int. Cl.
*H01L 33/62* (2010.01)
*H01L 33/52* (2010.01)
(Continued)

(52) U.S. Cl.
CPC ............. *H01L 33/62* (2013.01); *G06F 1/189* (2013.01); *H01L 25/0753* (2013.01); *H01L 33/52* (2013.01); *H01L 33/58* (2013.01)

(58) Field of Classification Search
CPC ... G06F 1/1605; H01L 25/0753; H01L 33/52; H01L 33/58
See application file for complete search history.

(56) References Cited

U.S. PATENT DOCUMENTS

| | | | |
|---|---|---|---|
| 2018/0190878 A1* | 7/2018 | Li | ............... G02B 5/085 |
| 2020/0043994 A1 | 2/2020 | Chen et al. | |
| 2021/0200366 A1* | 7/2021 | Bok | ............... H01L 27/3234 |

FOREIGN PATENT DOCUMENTS

| CN | 102376183 | 3/2012 |
|---|---|---|
| CN | 107071244 | 8/2017 |

(Continued)

OTHER PUBLICATIONS

"Office Action of China Counterpart Application", dated Oct. 9, 2021, p. 1-p. 7.

(Continued)

*Primary Examiner* — Jay C Chang
*Assistant Examiner* — Mikka Liu
(74) *Attorney, Agent, or Firm* — JCIPRNET

(57) ABSTRACT

A micro-LED display includes a casing, a light-transmitting cover, a micro-LED array substrate, a circuit board, and at least one functional component. The light-transmitting cover is disposed on the casing and has a display area, a non-display area, and a plurality of first vias. The first vias are located in the display area. The micro-LED array substrate is disposed between the light-transmitting cover and the casing. The micro-LED array substrate has a plurality of second vias overlapped with the first vias in an orthogonal projection direction. The circuit board is disposed between the micro-LED array substrate and the casing, and the circuit board has a functional component disposing area overlapped with the display area in the orthogonal projection direction. The functional component is disposed in the functional component disposing area. The functional component is overlapped with the second vias in the orthogonal projection direction.

12 Claims, 6 Drawing Sheets

(51) Int. Cl.
  *H01L 33/58* (2010.01)
  *H01L 25/075* (2006.01)
  *G06F 1/18* (2006.01)

(56) References Cited

FOREIGN PATENT DOCUMENTS

| | | |
|---|---|---|
| CN | 108121070 | 6/2018 |
| CN | 108600430 | 9/2018 |
| CN | 109326180 | 2/2019 |
| CN | 109585487 | 4/2019 |
| CN | 109817658 | 5/2019 |
| CN | 110047866 | 7/2019 |
| CN | 110061014 | 7/2019 |
| CN | 110071160 | 7/2019 |
| CN | 110365819 | 10/2019 |
| CN | 110472620 | 11/2019 |
| CN | 110534031 | 12/2019 |
| CN | 110727133 | 1/2020 |
| CN | 111241865 | 6/2020 |
| CN | 111258101 | 6/2020 |
| CN | 111370461 | 7/2020 |
| CN | 111430439 | 7/2020 |
| CN | 111463233 | 7/2020 |
| CN | 111508368 | 8/2020 |
| KR | 20200077175 | 6/2020 |
| TW | 202010140 | 3/2020 |
| TW | 202011629 | 3/2020 |

OTHER PUBLICATIONS

"Notice of Allowance of China Counterpart Application," dated Jan. 6, 2022, p. 1-p. 4, in which the listed reference was/references were cited.

"Office Action of Taiwan Counterpart Application", dated Jan. 26, 2020, pp. 1-4.

\* cited by examiner

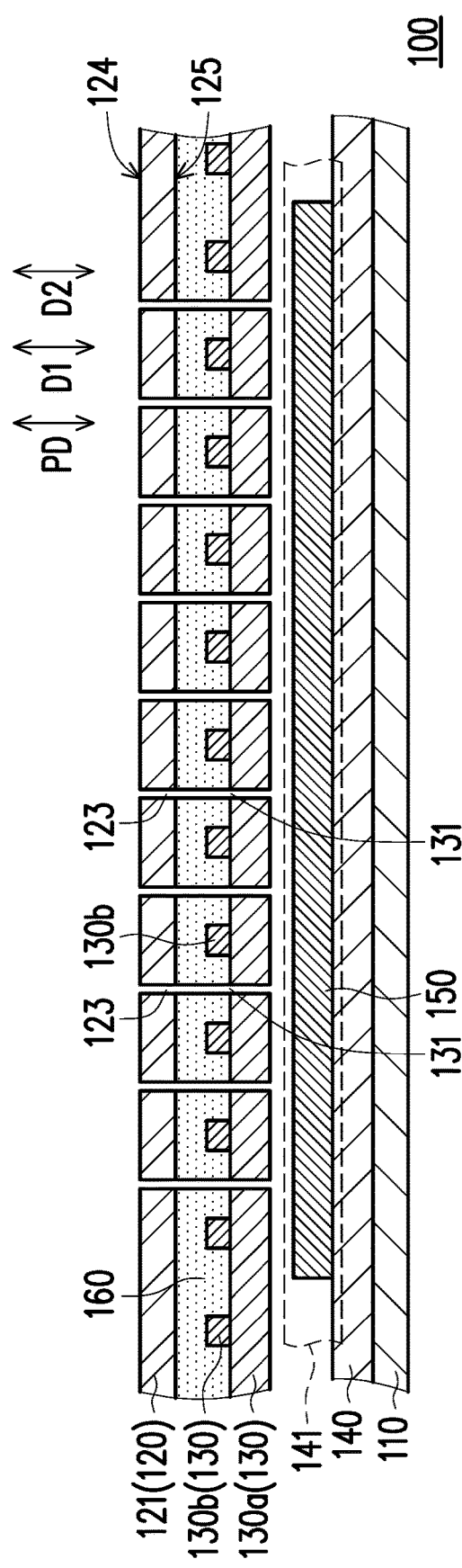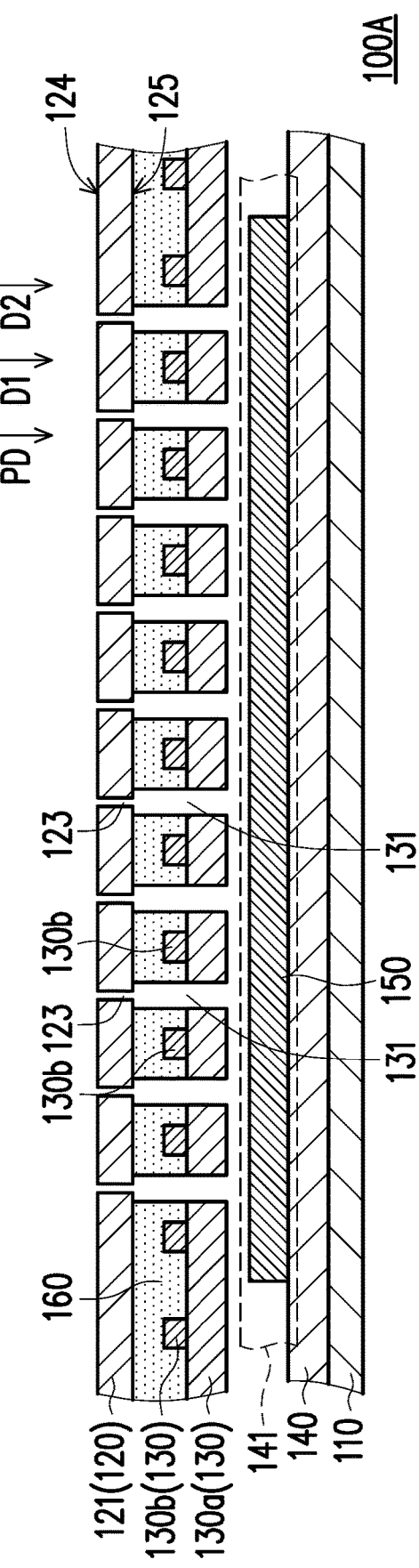

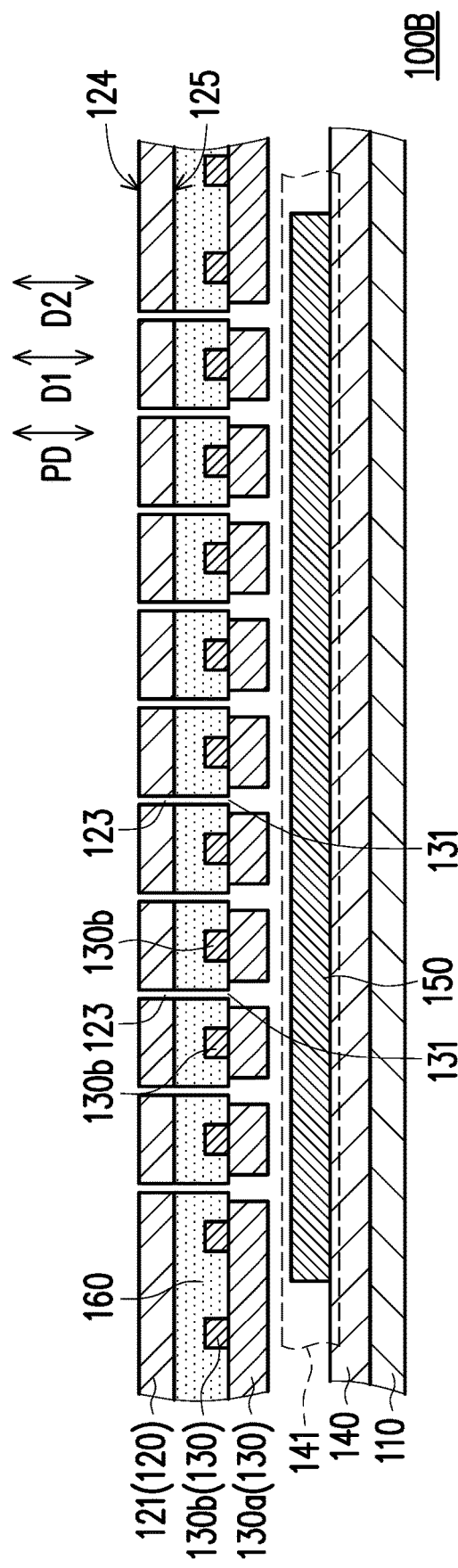
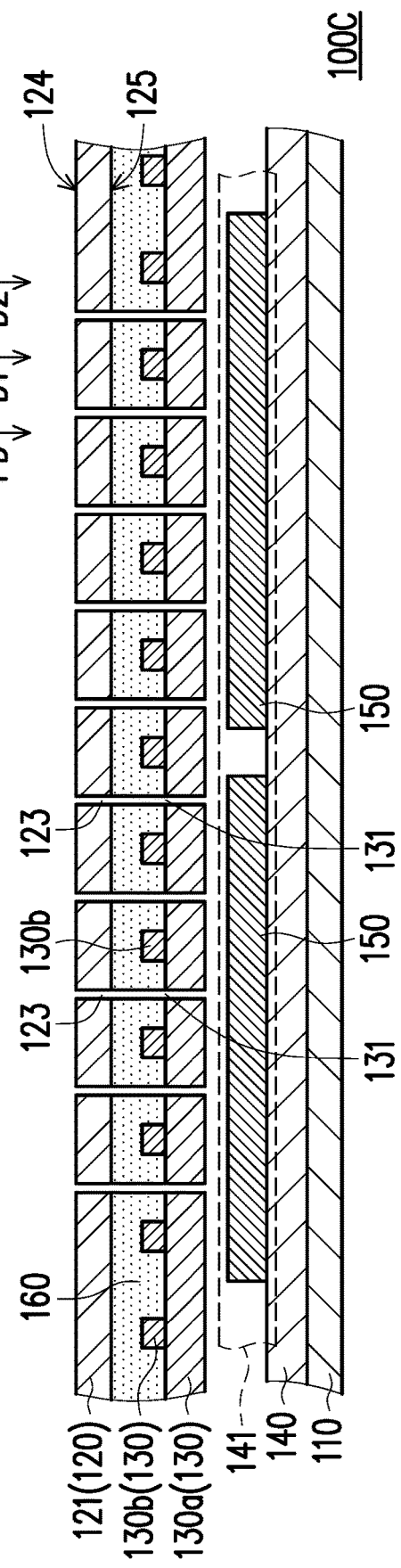
FIG. 2B
FIG. 2C

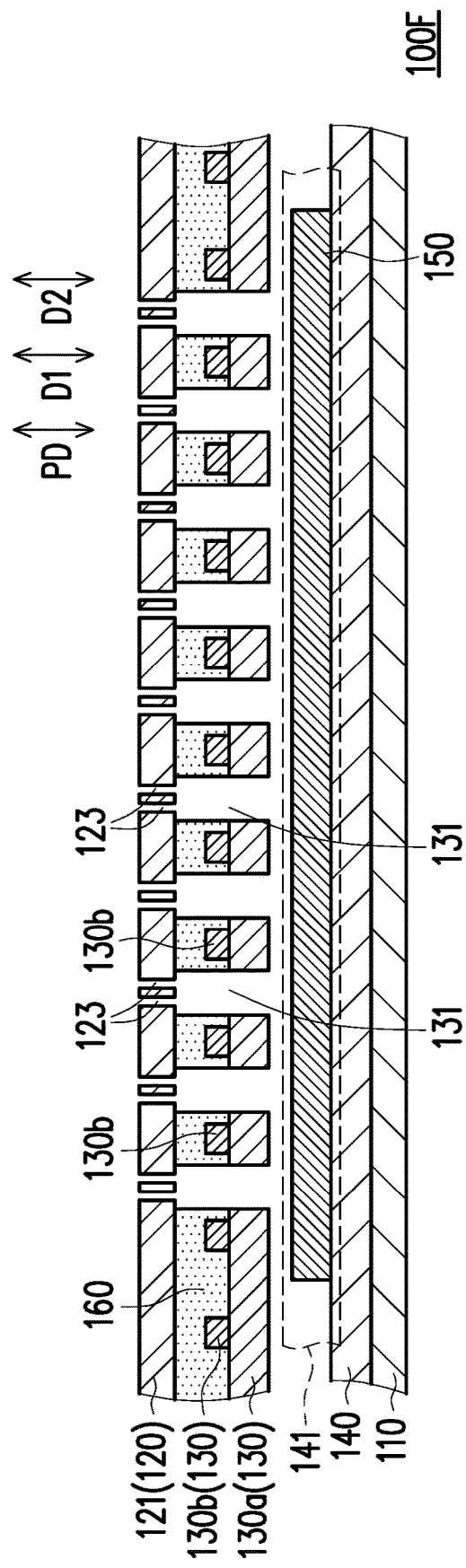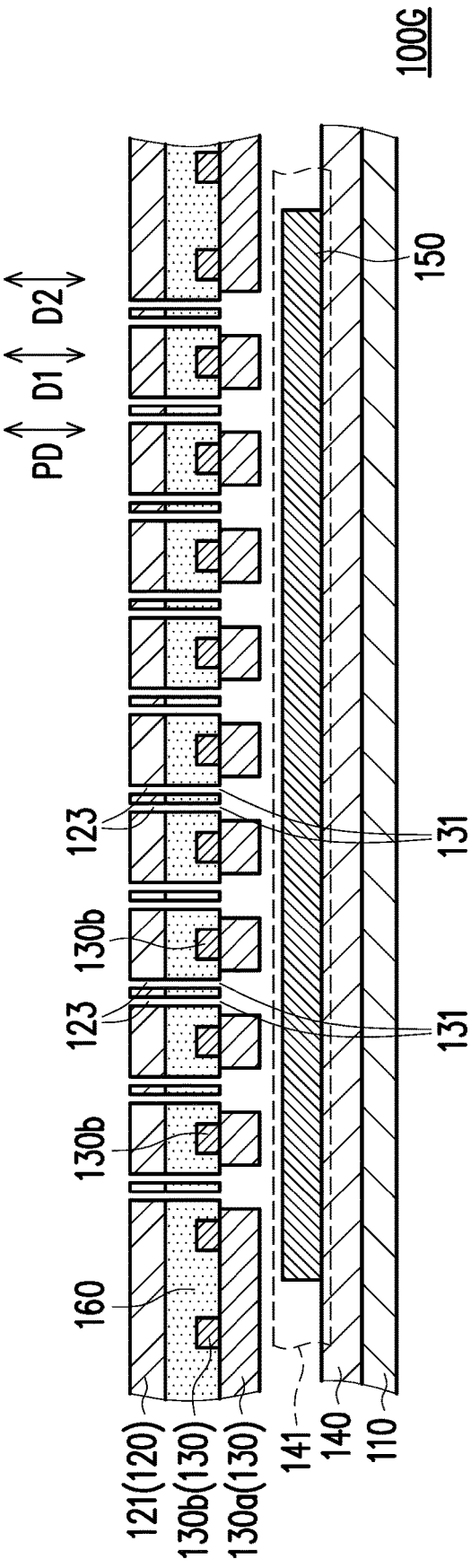

MICRO-LED DISPLAY

CROSS-REFERENCE TO RELATED APPLICATION

This application claims the priority benefit of Taiwan application serial no. 109126989, filed on Aug. 10, 2020. The entirety of the above-mentioned patent application is hereby incorporated by reference herein and made a part of this specification.

BACKGROUND

Technical Field

The disclosure relates to a display, and more particularly to a micro light-emitting diode (micro-LED) display.

Description of Related Art

As an image output interface, displays are commonly found in smart phones, tablet computers, laptop computers, desktop personal computers, all-in-one computers, or other electronic devices.

On the premise of the fixed size of a display, in order to increase the effective display area, narrow bezel and full-screen designs have become the current mainstream designs. Generally speaking, the display surface of a display can be roughly divided into a display area and a non-display area, and most functional components such as speakers, cameras, microphones, or sensors are disposed in the non-display area. In terms of a narrow bezel display, in order to preserve the configuration space for functional components such as speakers, cameras, microphones, or sensors, the reduction of the bezel is limited. In terms of a full-screen display, most functional components such as speakers, cameras, microphones, or sensors are disposed in a notch, but the notch takes up a part of the effective display area, which is not aesthetic and also destroys the integrity of the screen.

SUMMARY OF THE DISCLOSURE

The disclosure provides a micro light-emitting diode (micro-LED) display which not only meets the design requirements of narrow bezels or full screens but also maintains the integrity of the screen and increases the effective display area.

An embodiment of the disclosure provides a micro-LED display including a casing, a light-transmitting cover, a micro-LED array substrate, a circuit board, and at least one functional component. The light-transmitting cover is disposed on the casing and has a display area, a non-display area, and a plurality of first vias. The first vias are located in the display area. The micro-LED array substrate is disposed corresponding to the display area and between the light-transmitting cover and the casing. The micro-LED array substrate has a plurality of second vias, and the second vias are overlapped with the first vias in an orthogonal projection direction. The circuit board is disposed between the micro-LED array substrate and the casing, the circuit board has a functional component disposing area, and the functional component disposing area is overlapped with the display area in the orthogonal projection direction. The at least one functional component is disposed on the circuit board and located in the functional component disposing area. The at least one functional component is overlapped with the second vias in the orthogonal projection direction.

According to an embodiment of the disclosure, the micro-LED array substrate includes a circuit substrate and a plurality of micro-LEDs. The second vias penetrate through the circuit substrate. The micro-LEDs are arranged on the circuit substrate and located between the light-transmitting cover and the circuit substrate. At least one of the second vias is disposed between any two adjacent micro-LEDs.

According to an embodiment of the disclosure, the micro-LED array substrate further includes an encapsulating layer. The encapsulating layer covers the micro-LEDs and is disposed between the light-transmitting cover and the circuit substrate.

According to an embodiment of the disclosure, the second vias further penetrate through the encapsulating layer.

According to an embodiment of the disclosure, a thickness of each of the micro-LEDs ranges from 5 μm to 10 μm, and a side length of each of the micro-LEDs ranges from 3 μm to 50 μm.

According to an embodiment of the disclosure, the at least one functional component is overlapped with a part of the micro-LEDs in the orthogonal projection direction.

According to an embodiment of the disclosure, the at least one functional component includes a speaker, a camera, a microphone, a solar cell, or a sensor.

According to an embodiment of the disclosure, the non-display area surrounds the display area.

According to an embodiment of the disclosure, the light-transmitting cover further has an outer surface and an inner surface opposite to the outer surface, and the inner surface faces toward the micro-LED array substrate. The first vias penetrate through the outer surface and the inner surface.

According to an embodiment of the disclosure, an extending direction of the first vias is perpendicular to the outer surface.

According to an embodiment of the disclosure, an extending direction of the second vias is perpendicular to the outer surface.

According to an embodiment of the disclosure, apertures of the first vias in the light-transmitting cover are different from apertures of the second vias in the circuit substrate.

Based on the above, in the micro-LED display of the disclosure, the functional component adopts an under-display design. That is, the functional component is arranged right under the display area. The under-display design can not only meet the design requirements of narrow bezels or full screens but also maintain the integrity of the screen and increase the effective display area.

In order to make the aforementioned features and advantages of the disclosure comprehensible, embodiments accompanied with drawings are described in detail below.

BRIEF DESCRIPTION OF THE DRAWINGS

FIG. 1B is a schematic cross-sectional view of FIG. 1A taken along the line I-I.

FIG. 2A is a schematic cross-sectional view of part of a micro-LED display according to a second embodiment of the disclosure.

FIG. 2B is a schematic cross-sectional view of part of a micro-LED display according to a third embodiment of the disclosure.

FIG. 2C is a schematic cross-sectional view of part of a micro-LED display according to a fourth embodiment of the disclosure.

FIG. 2F is a schematic cross-sectional view of part of a micro-LED display according to a seventh embodiment of the disclosure.

FIG. 2G is a schematic cross-sectional view of part of a micro-LED display according to an eighth embodiment of the disclosure.

DESCRIPTION OF THE EMBODIMENTS

Figure 1A:
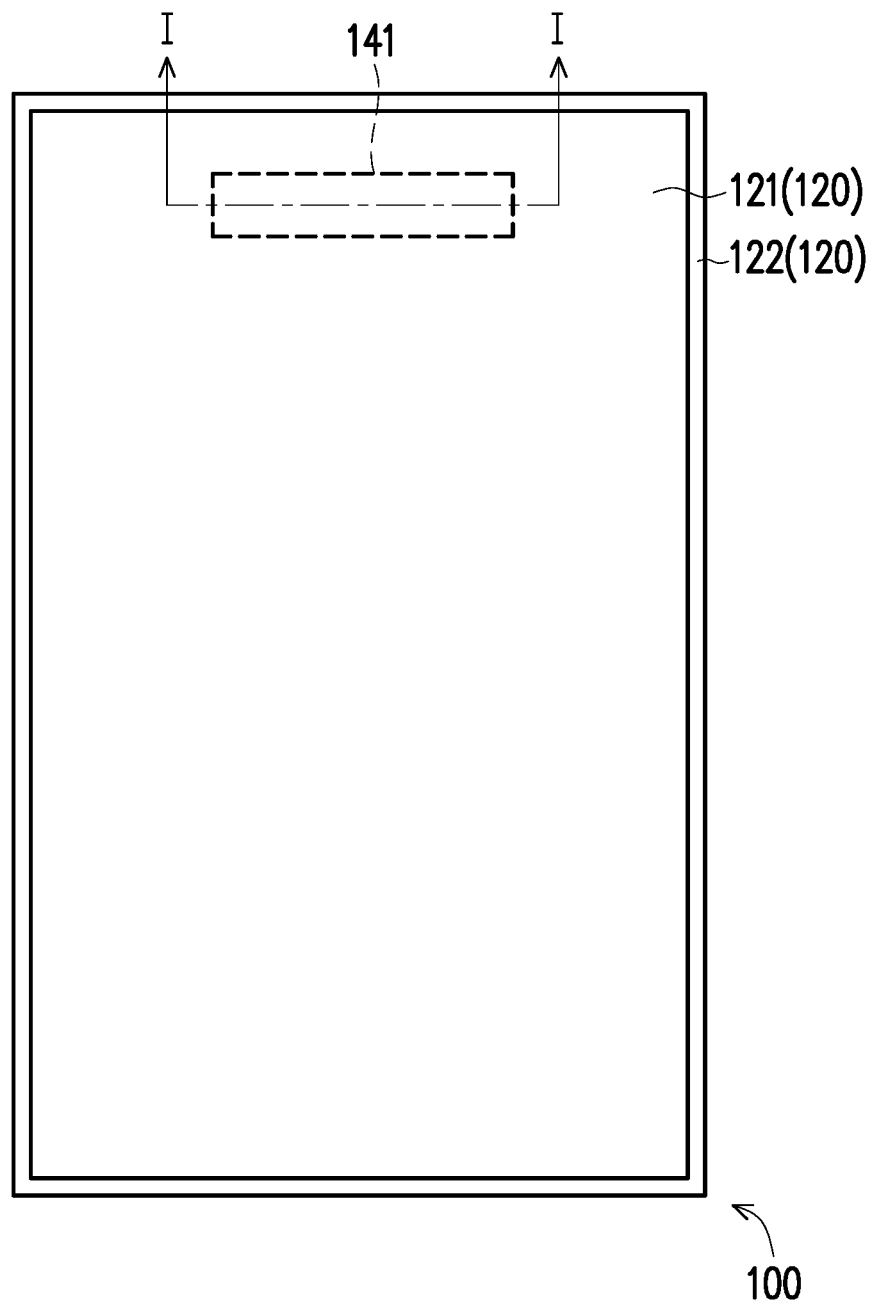
FIG. 1A is a schematic view of a micro-LED display according to a first embodiment of the disclosure.

FIG. 1A is a schematic view of a micro-LED display according to a first embodiment of the disclosure. FIG. 1B is a schematic cross-sectional view of FIG. 1A taken along the line I-I. Referring to FIG. 1A and FIG. 1B, in the embodiment, a micro-LED display 100 may be embodied in a smart phone, a tablet computer, a laptop computer, a desktop personal computer, an all-in-one computer, or other electronic devices. The micro-LED display 100 includes a casing 110, a light-transmitting cover 120, a micro-LED array substrate 130, a circuit board 140, and at least one functional component 150.

The light-transmitting cover 120 is disposed on the casing 110, the micro-LED array substrate 130 is disposed between the light-transmitting cover 120 and the casing 110, and the circuit board 140 is disposed between the micro-LED array substrate 130 and the casing 110. In other words, the circuit board 140, the micro-LED array substrate 130, and the light-transmitting cover 120 are arranged in vertical order from bottom to top. The casing 110 is configured to hold the circuit board 140, the micro-LED array substrate 130, and the light-transmitting cover 120; and the light-transmitting cover 120 is configured to protect the micro-LED array substrate 130 and the circuit board 140.

The light-transmitting cover 120 may be a glass cover, which has good light transmittance so that light emitted by the micro-LED array substrate 130 is transmitted outward. Specifically, the light-transmitting cover 120 has a display area 121, a non-display area 122, and a plurality of first vias 123. The micro-LED array substrate 130 is disposed corresponding to the display area 121, and the first vias 123 are located in the display area 121. In addition, the non-display area 122 is provided with an ink layer to shield the internal components or circuits of the micro-LED display 100. For example, the non-display area 122 is located at the periphery of the display area 121 and surrounds the display area 121. Alternatively, the non-display area 122 is covered by the casing 110 to be embedded in the casing 110.

The micro-LED array substrate 130 has a plurality of second vias 131, and the second vias 131 are aligned with the first vias 123 in an orthogonal projection direction PD. In addition, the orthogonal projection direction PD is substantially parallel to an extending direction D1 of the first via 123 and an extending direction D2 of the second via 131. Furthermore, the light-transmitting cover 120 further has an outer surface 124 and an inner surface 125 opposite to the outer surface 124, and the inner surface 125 faces toward the micro-LED array substrate 130. The outer surface 124 and the inner surface 125 are parallel to each other, the first vias 123 penetrate through the outer surface 124 and the inner surface 125, and the extending direction D1 of the first vias 123 and the extending direction D2 of the second vias 131 are substantially perpendicular to the outer surface 124.

Furthermore, in the orthogonal projection direction PD, each of the first vias 123 is overlapped with and communicates with one second via 131, and the aperture of each of the first vias 123 is the same as or similar to the aperture of the corresponding second via 131.

Referring to FIG. 1A and FIG. 1B, in the embodiment, the circuit board 140 has a functional component disposing area 141, and the functional component disposing area 141 is overlapped with the display area 121 in the orthogonal projection direction PD. In addition, the functional component 150 is disposed on the circuit board 140 and located in the functional component disposing area 141. In other words, the functional component 150 adopts an under-display design and is disposed right under the display area 121. The under-display design can not only meet the design requirements of narrow bezels or full screens but also maintain the integrity of the screen and increase the effective display area.

Furthermore, the functional component 150 is overlapped with the second vias 131 in the orthogonal projection direction PD, and thus audio signals or optical signals are transmitted from the external environment to the interior of the micro-LED display 100 through the first vias 123 and the second vias 131 and received by the functional component 150. Alternatively, audio signals or optical signals emitted by the functional component 150 are transmitted from the interior of the micro-LED display 100 to the external environment through the second vias 131 and the first vias 123. For example, the functional component 150 may be a speaker, a camera lens, a microphone, a solar cell, or a sensor; and the sensor may be a proximity sensor, an infrared sensor, a light sensor, an optical transceiver, or other applicable sensors.

Referring to FIG. 1B, the micro-LED array substrate 130 includes a circuit substrate 130a, a plurality of micro-LEDs 130b, and an encapsulating layer 160 covering the micro-LEDs 130b. The micro-LEDs 130b are disposed on the circuit substrate 130a, and the second vias 131 penetrate through the circuit substrate 130a and the encapsulating layer 160. The micro-LEDs 130b are located between the light-transmitting cover 120 and the circuit substrate 130a, the light-transmitting cover 120 is attached to the encapsulating layer 160, and the encapsulating layer 160 is disposed between the light-transmitting cover 120 and the circuit substrate 130a.

In detail, one second via 131 and one first via 123 are disposed between two adjacent micro-LEDs 130b. In other words, in the orthogonal projection direction PD, the first vias 123 are not overlapped with the micro-LEDs 130b, and the second vias 131 are neither overlapped with the micro-LEDs 130b. In other embodiments, the circuit substrate 130a has a plurality of arrays of display pixels, and each display pixel is provided with at least three micro-LEDs 130b capable of emitting red, blue, and green light respectively to display a full-color image. Moreover, the second vias 131 are respectively formed between two adjacent display pixels.

On the other hand, the encapsulating layer 160 is, for example, an optically clear adhesive (OCA) or other transparent film layers. The size and the thickness of the functional component 150 are greater than the size and the thickness of the micro-LED 130b, and also greater than the arrangement pitch between any two adjacent micro-LEDs 130b.

For example, each of the micro-LEDs 130b may be an LED crystal grain with a side length of less than 100 µm and a thickness of less than 10 µm. Furthermore, the side length of each of the micro-LEDs 130b ranges from 3 µm to 50 µm, and the thickness of each of the micro-LEDs 130b ranges from 5 µm to 10 µm. The size and the thickness of the functional component 150 are greater than the size and the thickness of each of the micro-LEDs 130b, and greater than the arrangement pitch between any two adjacent micro-LEDs 130b. Furthermore, the functional component 150 is overlapped with a part of the micro-LEDs 130b in the orthogonal projection direction PD. In addition, the aperture of each of the first vias 123 or the aperture of each of the second vias 131 ranges from 1 µm to 20 µm to ensure that audio signals or optical signals are transmitted between the external environment and the interior of the micro-LED display 100. Since the aperture of each of the first vias 123 ranges from 1 µm to 20 µm, the first vias 123 are difficult to be observed by the user's naked eyes.

FIG. 2A is a schematic cross-sectional view of part of a micro-LED display according to a second embodiment of the disclosure. Referring to FIG. 2A, compared to the micro-LED display 100 of FIG. 1B, in the micro-LED display 100A of the embodiment, the aperture of each of the second vias 131 is greater than the aperture of the corresponding first via 123.

FIG. 2B is a schematic cross-sectional view of part of a micro-LED display according to a third embodiment of the disclosure. Referring to FIG. 2B, compared to the micro-LED display 100 of FIG. 1B, in the micro-LED display 100B of the embodiment, each of the second vias 131 is divided into a lower via penetrating through the circuit substrate 130a and an upper via penetrating through the encapsulating layer 160, the aperture of each of the lower vias is greater than the aperture of the corresponding upper via, and the aperture of each of the upper vias is the same as or similar to the aperture of the corresponding first via 123.

FIG. 2C is a schematic cross-sectional view of part of a micro-LED display according to a fourth embodiment of the disclosure. Referring to FIG. 2C, compared to the micro-LED display 100 of FIG. 1B, in the micro-LED display 100C of the embodiment, two functional components 150 are disposed in the functional component disposing area 141, and the two functional components 150 may be speakers, camera lenses, microphones, solar cells, sensors, or a combination thereof. In the orthogonal projection direction PD, one of the two functional components 150 is overlapped with a part of the second vias 131, and the other of the two functional components 150 is overlapped with another part of the second vias 131. In particular, the aperture designs of the first via 123 and the second via 131 in the embodiment may be adjusted according to the aperture designs of the first via 123 and the second via 131 in the second embodiment or the aperture designs of the first via 123 and the second via 131 in the third embodiment.

Figure 2D:
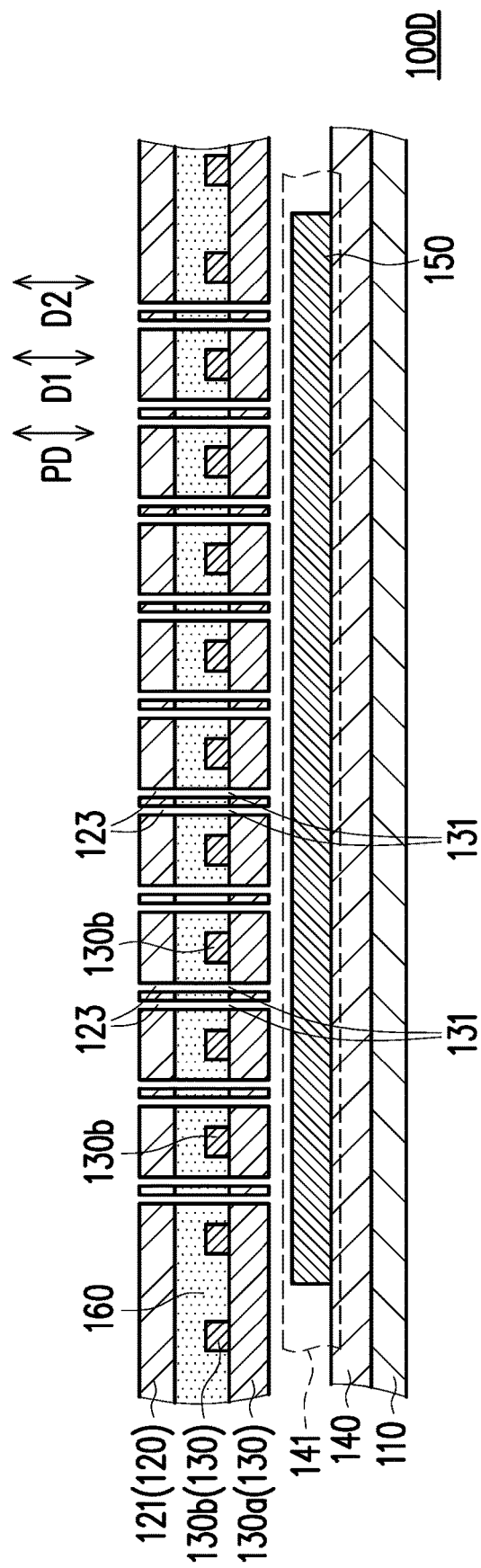
FIG. 2D is a schematic cross-sectional view of part of a micro-LED display according to a fifth embodiment of the disclosure.

FIG. 2D is a schematic cross-sectional view of part of a micro-LED display according to a fifth embodiment of the disclosure. Referring to FIG. 2D, compared to the micro-LED display 100 of FIG. 1B, in the micro-LED display 100D of the embodiment, two second vias 131 and two first vias 123 are disposed between any two adjacent micro-LEDs 130b. In the orthogonal projection direction PD, each of the first vias 123 is overlapped with one second via 131, and the aperture of each of the first vias 123 is the same as or similar to the aperture of the corresponding second via 131.

Figure 2E:
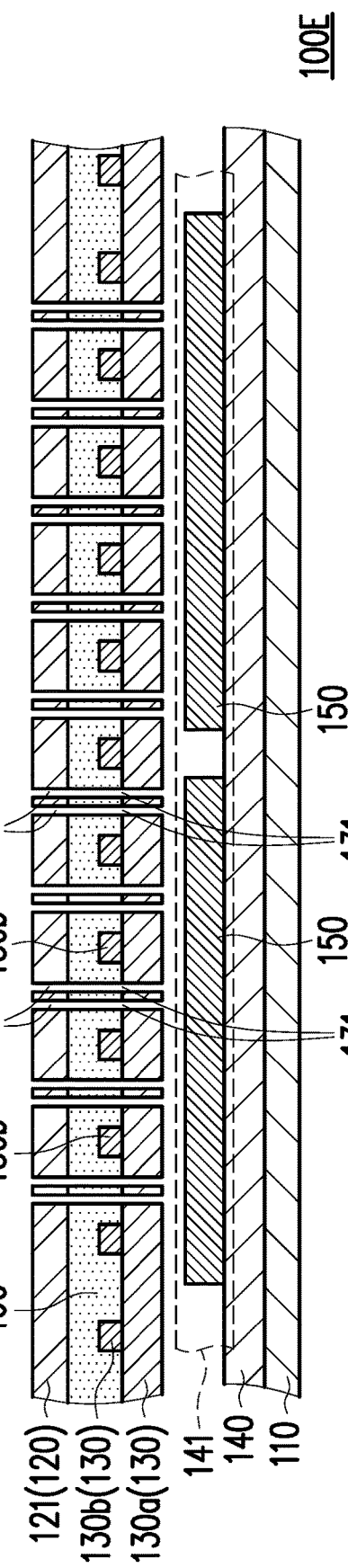
FIG. 2E is a schematic cross-sectional view of part of a micro-LED display according to a sixth embodiment of the disclosure.

FIG. 2E is a schematic cross-sectional view of part of a micro-LED display according to a sixth embodiment of the disclosure. Referring to FIG. 2E, compared to the micro-LED display 100D of FIG. 2D, in the micro-LED display 100E of the embodiment, two functional components 150 are disposed in the functional component disposing area 141, and the two functional components 150 may be speakers, camera lenses, microphones, solar cells, sensors, or a combination thereof. In the orthogonal projection direction PD, one of the two functional components 150 is overlapped with a part of the second vias 131, and the other of the two functional components 150 is overlapped with another part of the second vias 131.

FIG. 2F is a schematic cross-sectional view of part of a micro-LED display according to a seventh embodiment of the disclosure. Referring to FIG. 2F, compared to the micro-LED display 100D of FIG. 2D, in the micro-LED display 100F of the embodiment, merely one second via 131 is disposed between any two adjacent micro-LEDs 130b. In the orthogonal projection direction PD, two first vias 123 located between two adjacent micro-LEDs 130b are overlapped with one second via 131, and the aperture of the second via 131 is greater than the apertures of the two first vias 123.

FIG. 2G is a schematic cross-sectional view of part of a micro-LED display according to an eighth embodiment of the disclosure. Referring to FIG. 2G, compared to the micro-LED display 100G of FIG. 2D, in the micro-LED display 100G of the embodiment, each of the second vias 131 is divided into a lower via penetrating through the circuit substrate 130a and a upper via penetrating through the encapsulating layer 160, and the aperture of each of the upper vias is the same as or similar to the aperture of the corresponding first via 123. On the other hand, the two lower vias of the two second vias 131 located between the two adjacent micro-LEDs 130b communicate with each other, so the apertures of the two lower vias communicating with each other are greater than the apertures of the two upper vias, and are greater than the apertures of the two first vias 123.

In particular, the aperture design of the first via 123 and the second via 131 in the sixth embodiment may be adjusted according to the aperture design of the first via 123 and the second via 131 in the seventh embodiment or the aperture design of the first via 123 and the second via 131 in the eighth embodiment.

Figure 3:
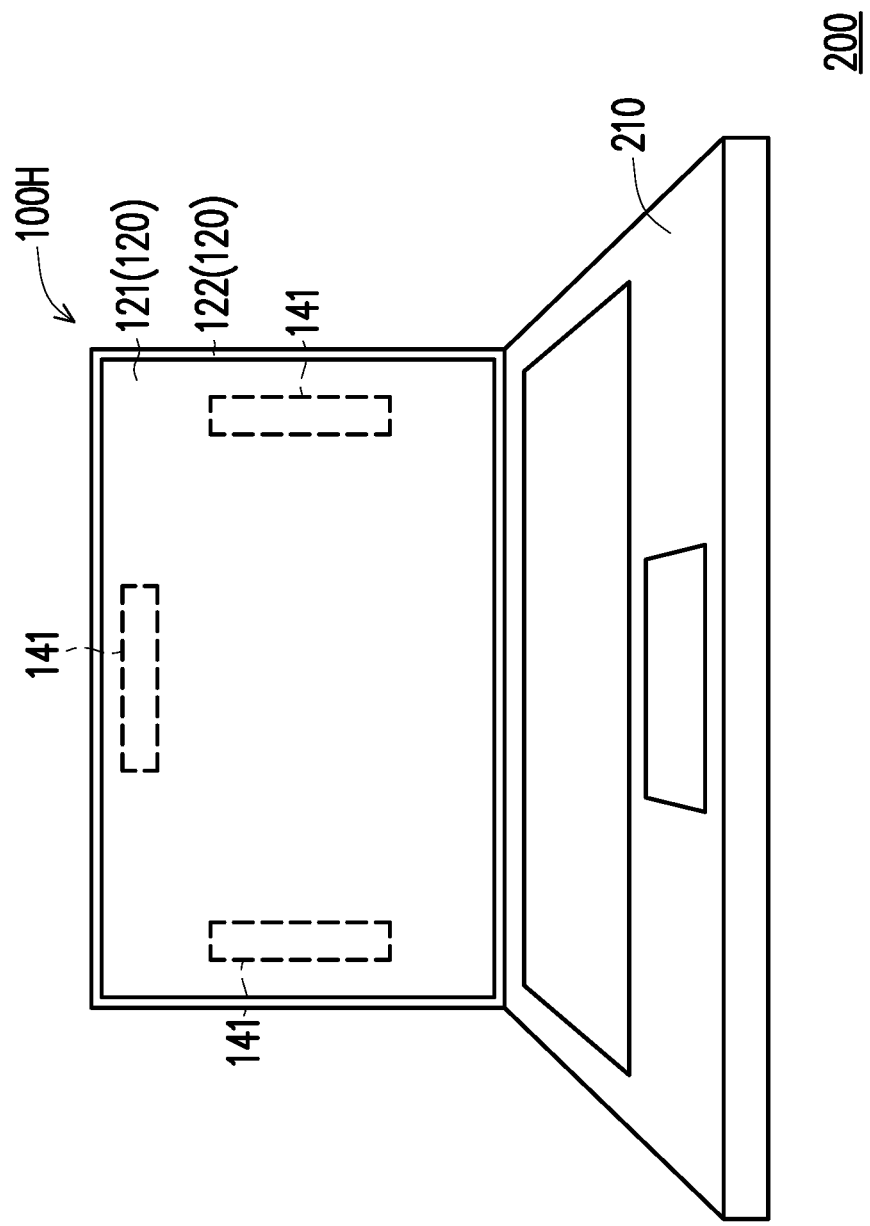
FIG. 3 is a schematic view of a micro-LED display integrated into a laptop computer according to another embodiment of the disclosure.

FIG. 3 is a schematic view of a micro-LED display integrated into a laptop computer according to another embodiment of the disclosure. Referring to FIG. 3, in the embodiment, the micro-LED display 100H may be a part of a laptop computer 200 and connected to a host 210. For example, the micro-LED display 100H has three under-display functional component disposing areas 141, but the quantity of the functional component disposing areas 141 may be increased or decreased according to actual design requirements.

On the other hand, the design principle of the micro-LED display 100H may refer to the design principles of other micro-LED displays, such as the micro-LED display 100 in the first embodiment, the micro-LED display 100A in the second embodiment, the micro-LED display 100B in the third embodiment, the micro-LED display 100C in the fourth embodiment, the micro-LED display 100D in the fifth embodiment, the micro-LED display 100E in the sixth embodiment, the micro-LED display 100F in the seventh embodiment, the micro-LED display 100G in the eighth embodiment, or a combination thereof.

Based on the above, in the micro-LED display of the disclosure, the functional component adopts an under-display design. That is, the functional component is arranged right under the display area. The under-display design can not only meet the design requirements of narrow bezels or full screens but also maintain the integrity of the screen and increase the effective display area. Furthermore, the light-transmitting cover is provided with the first vias at the place corresponding to the functional component, and in the orthogonal projection direction, the micro-LED array substrate is provided with the second vias overlapped with the first vias, so that audio signals or optical signals are transmitted from the external environment to the interior of the micro-LED display through the first vias and the second vias and received by the functional component. Alternatively, the audio signals or optical signals emitted by the functional component are transmitted from the interior of the micro-LED display to the external environment through the second vias and the first vias.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A micro light-emitting diode (micro-LED) display, comprising:
    a casing;
    a light-transmitting cover disposed on the casing and comprising a display area, a non-display area, and a plurality of first vias, wherein the plurality of first vias are located in the display area;
    a micro-LED array substrate disposed corresponding to the display area and between the light-transmitting cover and the casing, wherein the micro-LED array substrate comprises a plurality of second vias, and the plurality of second vias are overlapped with the plurality of first vias in an orthogonal projection direction;
    a circuit board disposed between the micro-LED array substrate and the casing, wherein the circuit board comprises a functional component disposing area, and the functional component disposing area is overlapped with the display area in the orthogonal projection direction; and
    at least one functional component disposed on the circuit board and located in the functional component disposing area, wherein the at least one functional component is overlapped with the plurality of second vias in the orthogonal projection direction.

2. The micro-LED display according to claim 1, wherein the micro-LED array substrate comprises:
    a circuit substrate, wherein the plurality of second vias penetrate through the circuit substrate; and
    a plurality of micro-LEDs arranged on the circuit substrate and located between the light-transmitting cover and the circuit substrate, wherein at least one of the plurality of second vias is disposed between any two adjacent of the plurality of micro-LEDs.

3. The micro-LED display according to claim 2, wherein the micro-LED array substrate further comprises an encapsulating layer, the encapsulating layer covers the plurality of micro-LEDs, and the encapsulating layer is disposed between the light-transmitting cover and the circuit substrate.

4. The micro-LED display according to claim 3, wherein the plurality of second vias further penetrate through the encapsulating layer.

5. The micro-LED display according to claim 2, wherein a thickness of each of the plurality of micro-LEDs ranges from 5 μm to 10 μm, and a side length of each of the plurality of micro-LEDs ranges from 3 μm to 50 μm.

6. The micro-LED display according to claim 2, wherein the at least one functional component is overlapped with a part of the plurality of micro-LEDs in the orthogonal projection direction.

7. The micro-LED display according to claim 2, wherein apertures of the plurality of first vias in the light-transmitting cover are different from apertures of the plurality of second vias in the circuit substrate.

8. The micro-LED display according to claim 1, wherein the at least one functional component comprises a speaker, a camera, a microphone, a solar cell, or a sensor.

9. The micro-LED display according to claim 1, wherein the non-display area surrounds the display area.

10. The micro-LED display according to claim 1, wherein the light-transmitting cover further has an outer surface and an inner surface opposite to the outer surface, the inner surface faces toward the micro-LED array substrate, and the plurality of first vias penetrate through the outer surface and the inner surface.

11. The micro-LED display according to claim 10, wherein an extending direction of the plurality of first vias is perpendicular to the outer surface.

12. The micro-LED display according to claim 10, wherein an extending direction of the plurality of second vias is perpendicular to the outer surface.

* * * * *